United States Patent
Park

(10) Patent No.: US 7,248,527 B2
(45) Date of Patent: Jul. 24, 2007

(54) SELF REFRESH PERIOD CONTROL CIRCUITS

(75) Inventor: Sang-Kyun Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/190,430

(22) Filed: Jul. 27, 2005

(65) Prior Publication Data

US 2006/0023546 A1 Feb. 2, 2006

(30) Foreign Application Priority Data

Jul. 29, 2004 (KR) ............... 10-2004-0059567

(51) Int. Cl.
  *G11C 7/00* (2006.01)
  *G11C 8/00* (2006.01)
(52) U.S. Cl. ............ 365/222; 365/211; 365/233
(58) Field of Classification Search ............ 365/211, 365/222, 189.05, 189.08, 233
See application file for complete search history.

(56) References Cited

U.S. PATENT DOCUMENTS

| | | | |
|---|---|---|---|
| 4,716,551 A * | 12/1987 | Inagaki | 365/222 |
| 5,446,696 A * | 8/1995 | Ware et al. | 365/222 |
| 5,532,968 A * | 7/1996 | Lee | 365/222 |
| 6,438,057 B1 | 8/2002 | Ruckerbauer | 365/222 |
| 6,756,856 B2 * | 6/2004 | Song et al. | 365/222 |
| 6,768,693 B2 * | 7/2004 | Feurle et al. | 365/222 |
| 6,940,775 B2 * | 9/2005 | Schneider et al. | 365/222 |
| 7,027,343 B2 * | 4/2006 | Sinha et al. | 365/222 |
| 7,035,157 B2 * | 4/2006 | Chang | 365/222 |
| 2003/0156438 A1 | 8/2003 | Neild et al. | 363/97 |

\* cited by examiner

*Primary Examiner*—Trong Phan
(74) *Attorney, Agent, or Firm*—Mills & Onello LLP

(57) ABSTRACT

In a self refresh period control circuit for controlling a refresh period of a semiconductor memory device in response to operating temperature of the device, a temperature sensor part generates a first period control signal in response to a self refresh start signal or self refresh completion signal, senses operating temperature of the semiconductor memory device in response to a clock signal generated by the self refresh start signal, and generates a corresponding second period control signal. A period magnification control part controls a self refresh period in response to the first and second period control signals. Accordingly, a refresh period characteristic change based on operating temperature, which is causable by an initial self refresh, is implemented.

19 Claims, 9 Drawing Sheets

SELF REFRESH PERIOD CONTROL CIRCUITS

CROSS REFERENCE TO RELATED APPLICATIONS

This application claims priority under 35 U.S.C. §119 to Korean Patent Application 2004-59567, filed on Jul. 29, 2004, the contents of which are hereby incorporated by reference in their entirety.

BACKGROUND OF THE INVENTION

1. Technical Field

The present invention relates to a semiconductor memory device, and more particularly, to a self refresh period control circuit capable of controlling a refresh period in response to a temperature change in a manner that reduces current consumption and improves consumer reliability.

2. Description of the Background of the Invention

Semiconductor memory devices can generally be categorized as volatile memory devices and nonvolatile memory devices according to the retention or non-retention of data when an external power source is removed. Volatile memory devices include DRAM (Dynamic Random Access Memory) and SRAM (Static Random Access Memory), etc. Non-volatile memory devices include flash memory or ROM (Read Only Memory) etc. Volatile memory may be sub-categorized according to whether a recharge operation of data is required. That is, an SRAM cell is generally constructed of a flip-flop circuit and two switches, and data-static storage can be obtained by a feedback effect of the flip-flop as long as power source is applied. A DRAM cell, on the other hand, is constructed of a transistor serving as a switch and a capacitor storing data. Data storage is a result of charge accumulation in the capacitor, thus, in principle, there is no power consumption. However, leakage current is caused in a DRAM cell by a PN junction of MOS (Metal Oxide Semiconductor) transistor etc., and an initially stored charge volume is lost, thus data may be lost. To prevent loss of data, data within memory cells is read before losing data, and an initial charge volume must be again replenished in conformity with the read information. This operation is repeated periodically so as to maintain data storage. Such a recharge procedure of cell charge is referred to as a "refresh" operation.

The refresh operation can be classified according to an operating method, into an external refresh method of providing a refresh command in a DRAM controller, and a self refresh method of providing only a refresh start signal in a DRAM controller and performing a refresh operation in the device itself until a refresh completion signal is provided.

The self refresh method performs a refresh operation periodically by a period decided internally. Herewith, a re-charge period is called a refresh period and is decided by an accumulation volume in cell and by an accumulation volume and expiration time of cell.

When a computer system includes a sleep mode of operation, most of internal devices are turned off, but a semiconductor memory device such as a DRAM performs a refresh operation to continuously maintain data, and a self refresh current flows in the semiconductor memory device such as DRAM.

One of recent technology development trends is to vary the device refresh period in conformity with temperature and to reduce current consumption. That is, self refresh periods are determined respectively differently by chip internal temperature in a low power DRAM, to guarantee a refresh characteristic based on temperature and simultaneously to reduce power consumption. In such systems, temperature is divided into several regions, and at low temperatures, the period of refresh clock is lengthened relatively, so as to reduce current consumption. This is based on the known fact that that data retention time of a semiconductor memory device such as DRAM is lengthened with lowered temperature, and data retention time is relatively shorter at high temperatures than at low temperatures, thus the refresh must be performed more frequently at high operating temperatures. For that, devices are equipped with a temperature sensor, and a circuit for controlling the temperature sensor is required.

FIG. 1 is a block diagram of a conventional self refresh period control circuit employing a temperature sensor.

Referring to FIG. 1, the conventional self refresh period control circuit includes a temperature sensor part 10, a period magnification controller 20, a clock generator 30 and a refresh controller 40.

In the temperature sensor part 10, activation or deactivation of the operation is controlled in response to a clock signal MSB of the clock generator 30, and generates a period control signal TS to sense operating temperature of semiconductor memory device and select a self refresh period.

The period magnification controller 20 decides a magnification of a period clock signal TCLK applied by the clock generator 30 and outputs a refresh clock signal RS, in response to the period control signal TS.

The clock generator 30 applies a clock signal MSB having a longest period of a most significant bit(MSB) among a plurality of clock signals CLK having individually different periods, to the temperature sensor part 10, in response to a self refresh start signal SRS. Also, the clock generator 30 selects a clock signal having a predetermined period, and applies the selected period clock signal TCLK to the period magnification controller 20.

The refresh controller 40 performs a control operation to execute a refresh operation with a predetermined period in response to the refresh clock signal RS.

FIG. 2 is a detailed block diagram of the temperature sensor part 10 shown in FIG. 1.

With reference to FIG. 2, the temperature sensor part 10 of FIG. 1 includes a temperature sensor 12, an amplifier 14, a latch 16 and a sampling clock generator 18.

The sampling clock generator 18 generates a sampling clock signal SCLK in response to the clock signal MSB, the sampling clock signal SCLK having the same period as the clock signal MSB and having a relatively short low level section as compared with a high level section.

In the temperature sensor 12, an activation or deactivation of operation is controlled in response to a sampling clock signal SCLK. The temperature sensor 12 generates a temperature signal Ti indicating an operating temperature of predetermined semiconductor memory device. The temperature sensor 12 operates only in a low level section of sampling clock signal SCLK.

The amplifier 14 amplifies a temperature signal Ti of the temperature sensor 12 and outputs the amplified temperature signal TA to the latch 16.

The latch 16 receives the amplified temperature signal TA of the amplifier 14, and generates a period control signal TS for a selection of self refresh period in response to a sampling clock signal SCLK.

FIG. 3 illustrates the timing of the operation of the temperature sensor part 10 shown in FIG. 2.

The operation of the conventional self refresh period control circuit will now be described, with reference to FIGS. 1 to 3.

As shown in FIGS. 1 to 3, the clock generator 30 generates clock signals MSB and TCLK having a number of bits which are used as clock signals that control a refresh period, in response to a self refresh start signal SRS,enter. The sampling clock generator 18 generates a sampling clock signal SCLK in response to a clock signal MSB having the longest period among clock signals MSB and TCLK having a number of bits. The sampling clock signal SCLK has the same period as the clock signal MSB, but is provided as a pulse signal having a relatively short low level section, as compared with a high level section.

The temperature sensor 12 operates only in a low level section of sampling clock signal SCLK, but does not operate in a high level section. The temperature sensor 12 generates a temperature signal Ti that indicates operating temperature of a predetermined semiconductor memory device during operation. Herewith, the semiconductor memory device is provided with an installation of self refresh period control circuit.

After a refresh operation start, the temperature sensor 12 senses operating temperature of semiconductor memory device, and when the operating temperature is higher than a reference temperature, a temperature signal Ti is generated at a high level, and when lower than the reference temperature, a temperature signal Ti at a low level is generated. The temperature signal Ti is amplified by amplifier 14.

The latch 16 latches a temperature signal TA having a changed level. In other words, the latch 16 receives a temperature signal TA and latches a period control signal TS at a high level when the temperature signal TA has the high level in response to a sampling clock signal SCLK, and then, when the temperature signal TA is lowered to a low level, the period control signal TS is also lowered to a low level. The latch 16 retains the output of the temperature sensor 12, even if the temperature sensor 12 is not operating. The period control signal TS is applied to the period magnification controller 20. The latch is configured so that an initial value is determined as a high level when the initial power source is supplied.

The period magnification controller 20 decides and selects a period magnification of clock signal TCLK applied by the clock generator 30, and generates a refresh period signal RS. When the period control signal TS has a high level, a refresh period is decided in a lowest magnification, and when the period control signal TS has a low level, the refresh period is decided in a highest magnification within a range of guaranteeing a refresh characteristic of semiconductor memory device.

The refresh controller 40 performs a refresh operation in response to the refresh period signal RS. The self refresh operation is completed in response to a self refresh completion signal SRS,exit.

In the conventional self refresh period control circuit, in which the period control signal TS has a low level, and a self refresh operation is completed by a self refresh completion signal SRS,exit, and restarts by a self refresh start signal SRS,enter; before the temperature sensor 12 operates, the self refresh operation is performed on the basis of a refresh period that the period control signal TS has the low level. That is, as shown in FIG. 3, at a section II where the period control signal TS has a low level, a self refresh operation is performed on the basis of a refresh period based on low temperature, and at a section III where the period control signal TS has a high level, a self refresh is performed on the basis of a refresh period based on high temperature. In other words, at section I from the time of the generation of the self refresh start signal SRS,enter to a time prior to generation of the period control signal TS through a temperature sensing of the temperature sensor 12; a self refresh is performed by a refresh period of a previously generated period control signal TS, thus there is a problem during this time period that operation is improper for refresh characteristics based on temperature.

SUMMARY OF THE INVENTION

Accordingly, it would be desirable to provide a self refresh period control circuit having a refresh period that is responsive to refresh characteristics based on temperature, which is capable of supplementing a self refresh characteristic during a time section from an initiation of a self refresh operation to a time before operation of the temperature sensor.

According to an aspect of the present invention, a self refresh period control circuit for controlling a refresh period of a semiconductor memory device, in response to an operating temperature, comprises a temperature sensor part for generating a first period control signal in response to a self refresh start signal or self refresh completion signal, sensing operating temperature of the semiconductor memory device in response to a clock signal generated by the self refresh start signal, and, in response, generating a second period control signal; and a period magnification control part for controlling a self refresh period in response to the first and second period control signals.

In one embodiment, the self refresh period control circuit further comprises a refresh control part for performing a self refresh operation by the self refresh period selected by the period magnification control part.

In another embodiment, the temperature sensor part includes a sampling clock generator for generating a sampling clock signal having a predetermined period in response to a clock signal generated in response to self refresh start signal; a temperature sensor for sensing the operating temperature of the semiconductor memory device and generating a temperature signal in response to the sampling clock signal; an amplifier for amplifying the temperature signal; an auto pulse generator for generating a single pulse in response to the self refresh start signal or self refresh completion signal; and a latch for generating the first period control signal in response to the single pulse of the auto pulse generator, and latching an output signal of the amplifier and generating a second period control signal.

In another embodiment, the period magnification control part may select a signal having a shortest self refresh period among predetermined periods in response to the first period control signal. The sampling clock signal has the same period as a clock signal generated in response to the self refresh start signal, and may be a clock signal having a short low level section as compared with a high level section. In another embodiment, the temperature sensor operates only in a low level section of the sampling clock signal. In another embodiment, the self refresh start signal and the self refresh completion signal are on the same signal line and a low level indicates the self refresh start signal and a high level indicates the self refresh completion signal.

In another embodiment, the auto pulse generator includes at least one inverter for inverting the self refresh completion signal and outputting the signal delayed by a predetermined time; a NAND circuit for receiving the self refresh completion signal and the signal delayed by the at least one inverter, to perform a NAND operation; and an inverter for inverting an output of the NAND circuit and generating a single pulse. In another embodiment, the auto pulse generator may include at least one inverter for inverting the self refresh start signal and outputting the signal delayed by a predetermined time; and a NOR circuit for receiving the self refresh start signal and the signal delayed by the at least one inverter, to perform a NOR operation and generate a single pulse.

In another embodiment, the first period control signal and the second period control signal are transmitted on a common signal line.

In the inventive systematic configuration is performed a refresh appropriate to a refresh characteristic change by reflecting a temperature change from a time of the generation of the self refresh completion signal to a time of the generation of self refresh start signal.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

Figure 1:
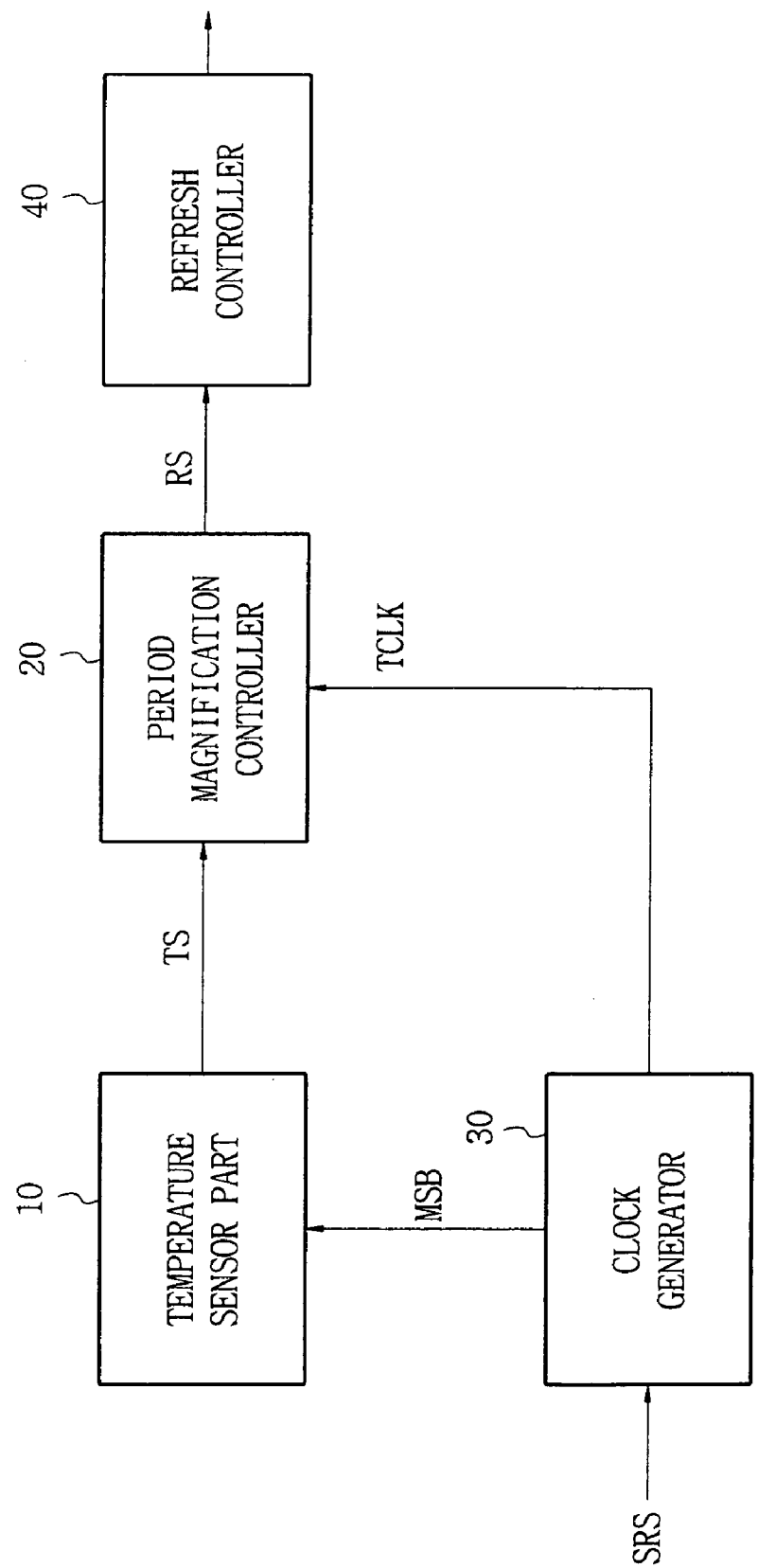
FIG. 1 is a block diagram of a conventional self refresh period control circuit according to a prior art.
Figure 2:
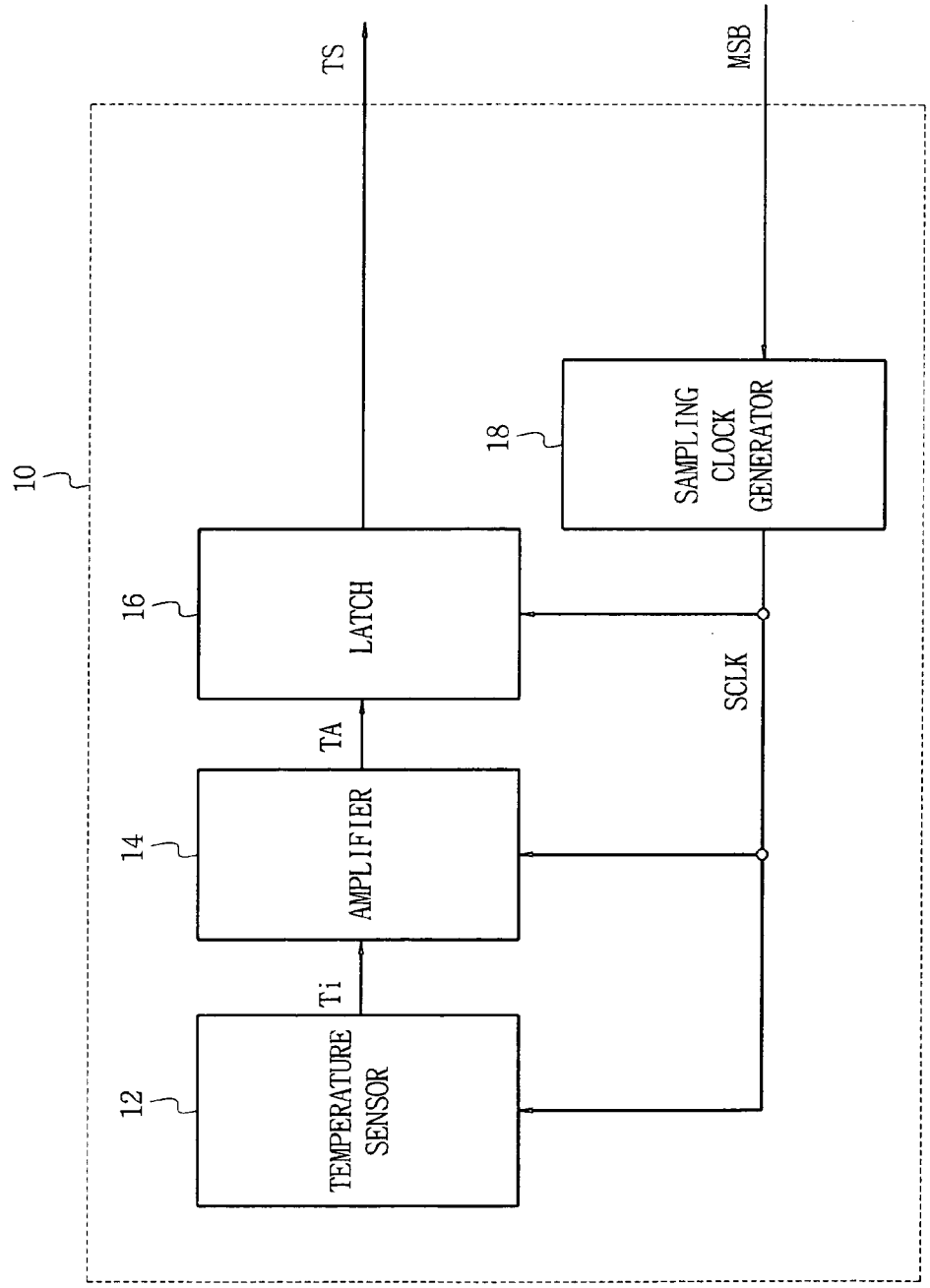
FIG. 2 is a detailed block diagram of the temperature sensor part shown in FIG. 1.
Figure 3:
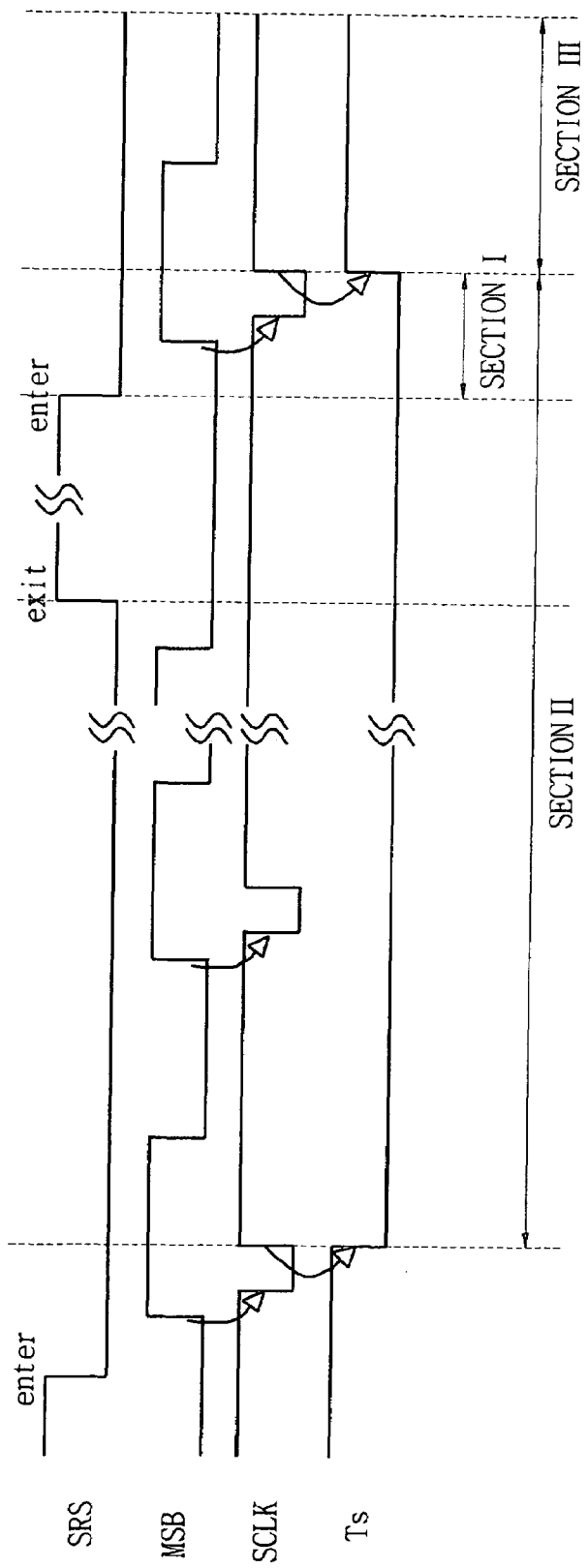
FIG. 3 is a timing diagram of the operations of the circuit of FIG. 1 and FIG. 2.
Figure 4:
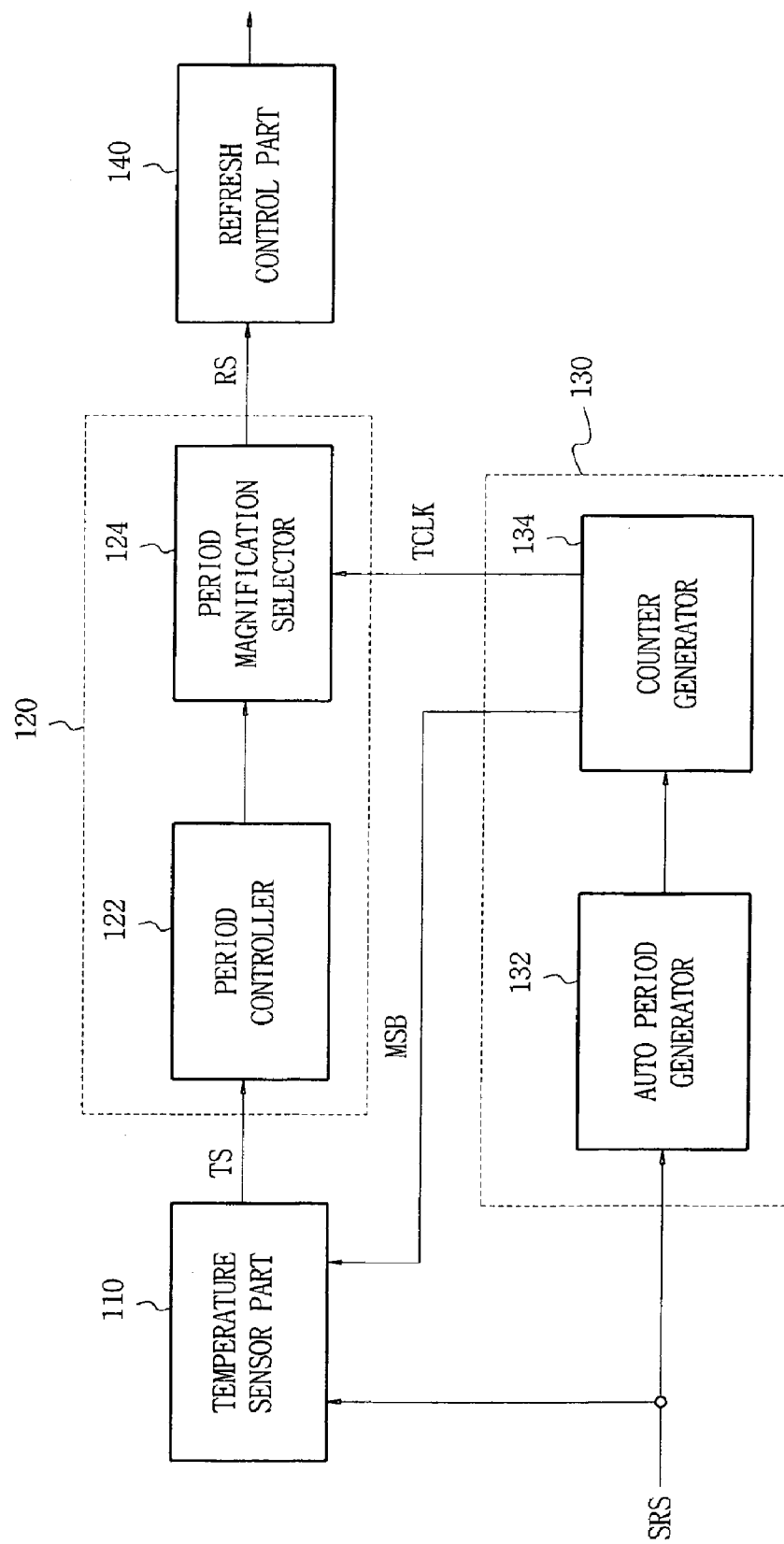
FIG. 4 is a block diagram of self refresh period control circuit according to an exemplary embodiment of the invention.

FIG. 4 is a block diagram of self refresh period control circuit according to an exemplary embodiment of the invention Referring to FIG. 4, a self refresh period control circuit according to an exemplary embodiment includes a temperature sensor part 110, a period magnification control part 120, a clock generating part 130 and a refresh control part 140.

The temperature sensor part 110 generates a first period control signal TS in response to a self refresh start signal SRS or self refresh completion signal SRS, senses the temperature of a semiconductor memory device provided with the installed temperature sensor in response to a clock signal MSB generated by the self refresh start signal SRS, and generates a corresponding second period control signal TS.

The period magnification control part 120 controls a self refresh period in response to the first and second period control signals TS. The period magnification control part 120 decides a magnification of period clock signal TCLK applied from the clock generating part 130 and outputs it as a refresh period signal RS, in response to the period control signals TS. In one embodiment, the first and second period control signals Ts are transmitted on the same, common, signal line. In other embodiments, the first and second period control signals Ts are different signals on different lines.

The period magnification control part 120 includes a period controller 122 for deciding a period magnification of refresh signal in response to the first period control signal TS and the second period control signal TS; and a period magnification selector 124 for generating a refresh period signal RS corresponding to the refresh period magnification decided by the period controller 122. The period magnification control part 120 selects a signal having a shortest self refresh period in response to the first period control signal TS, and generates a refresh period signal RS having an appropriate period in response to the second period control signal TS.

The clock generating part 130 applies a clock signal MSB having a longest period of a most significant bit (MSB) among a plurality of clock signals CLK having individually different periods, to the temperature sensor part 110, in response to a self refresh start signal SRS. Also, the clock generating part 130 selects a clock signal having a predetermined period, and applies the selected period clock signal TCLK to the period magnification control part 120.

The clock generating part includes an auto period generator 132 for selecting a clock signal having a predetermined period in response to the self refresh start signal SRS; and a counter generator 134 for generating the period clock signal TCLK selected by the auto period generator 132 and a clock signal MSB having a longest period.

The refresh control part 140 controls the performance of a self refresh operation with a predetermined period in response to the refresh period signal RS.

Figure 5:
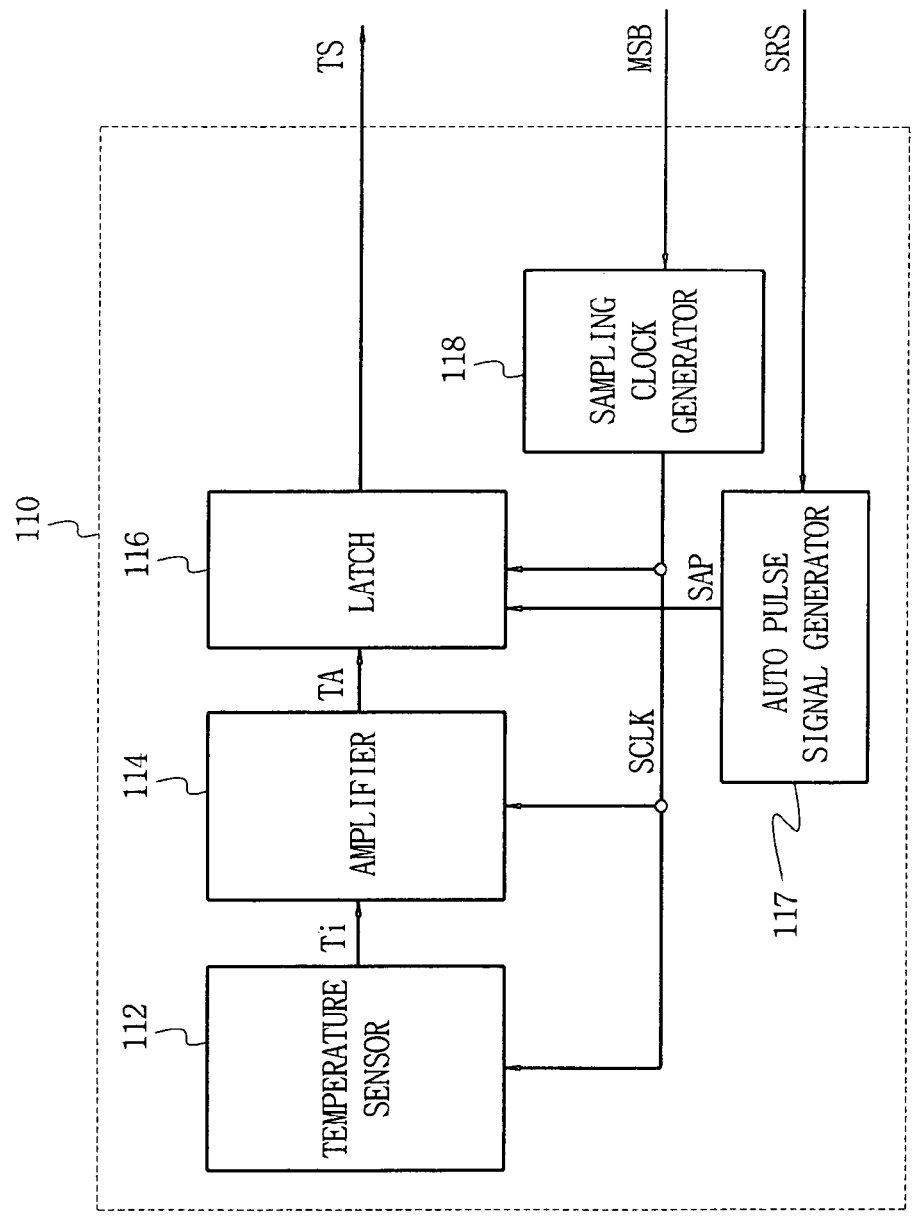
FIG. 5 is a detailed block diagram of temperature sensor part shown in FIG. 4.

FIG. 5 is a detailed block diagram of the temperature sensor part 110 shown in FIG. 4.

With reference to FIG. 5, the temperature sensor part 110 includes a sampling clock generator 118, a temperature sensor 112, an amplifier 114, an auto pulse generator 117 and a latch 116.

The sampling clock generator 118 generates a sampling clock signal SCLK having a predetermined period in response to clock signal MSB generated by the self refresh start signal SRS. The sampling clock signal SCLK may be, e.g., a clock signal SCLK that has the same period as the clock signal MSB and that has a relatively short low level section as compared with a high level section.

The temperature sensor 112 senses the temperature of a semiconductor memory device at which the temperature sensor is installed and generates a temperature signal Ti, in response to the sampling clock signal SCLK. The temperature sensor 112 operates only in a low level section of the sampling clock signal SCLK.

The amplifier 114 operates in response to the sampling clock signal SCLK, and amplifies the temperature signal Ti and generates the amplified temperature signal TA.

The self refresh start signal SRS or self refresh completion signal SRS may be a pulse signal that has a low level by the self refresh start signal SRS and that has a high level by the self refresh completion signal SRS.

The auto pulse generator 117 generates a single pulse SAP in response to the self refresh start signal SRS or self refresh completion signal SRS.

The latch 116 generates the first period control signal TS in response to a single pulse SAP of the auto pulse generator 117, and latches output signal TA of the amplifier 114 and generates a second period control signal TS.

Figure 6:
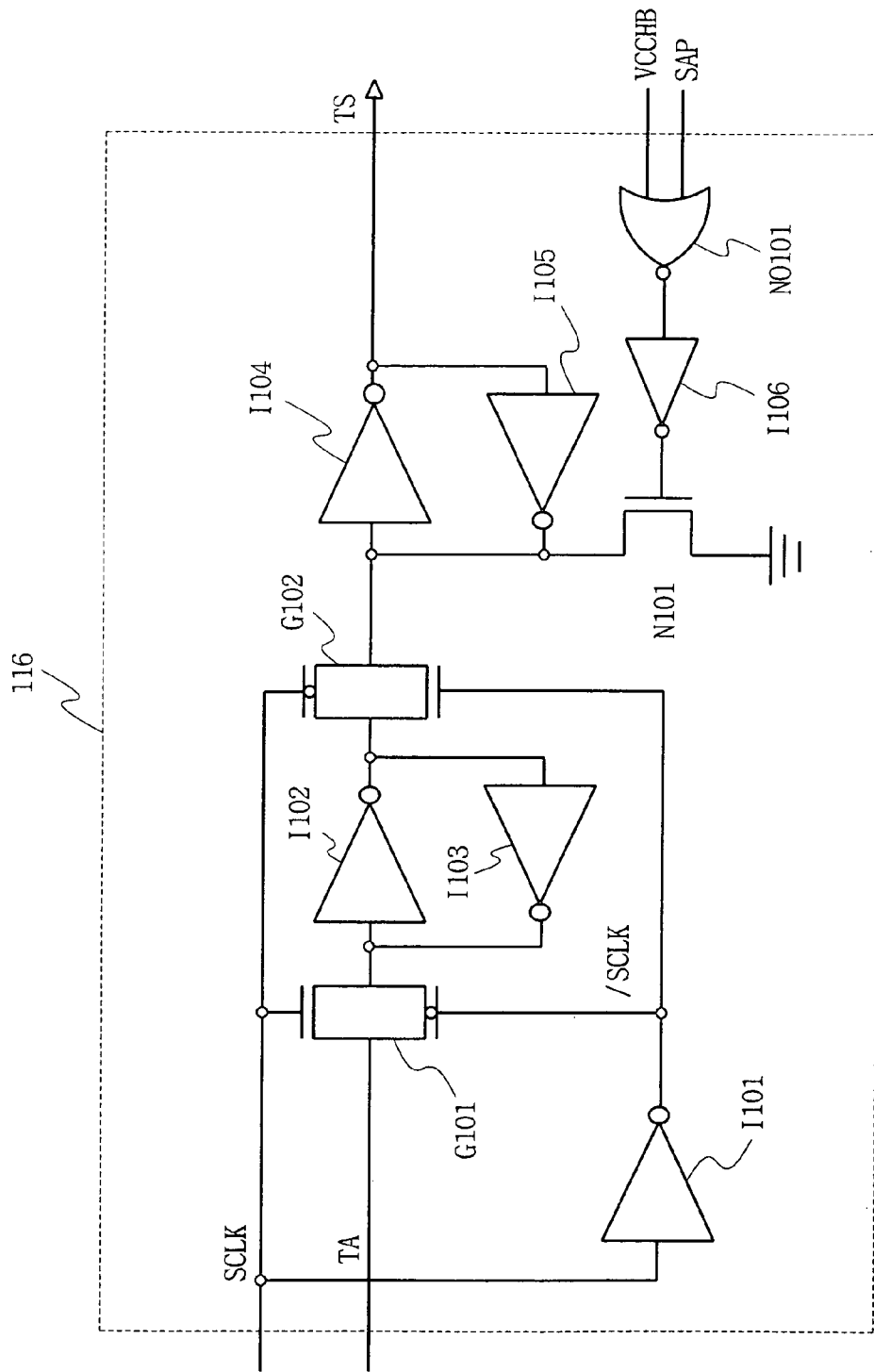
FIG. 6 is a detailed circuit diagram of an applied example of the latch shown in FIG. 5.

FIG. 6 is a circuit diagram illustrating in detail an applied example of a latch 116 shown in FIG. 5.

The latch 116 includes transmission gates G101 and G102, a plurality of inverters I102, I103, I104 and I105, a NOR circuit NO101 for performing a NOR-operation on a power-up signal VCCHB and an auto pulse SAP, an inverter I106 and an NMOS transistor N101, and an inverter I101 that receives the sampling clock signal SCLK and generates an inverted sampling clock signal/SCLK. The latch 116 is configured as shown in FIG. 6.

As shown in FIG. 6, the latch 116 may be configured so that temperature signal TA amplified by the amplifier 114 is latched by transmission gates G101 and G102 operating by sampling clock signal SCLK and by a plurality of inverters I102, I103, I104 and I105.

The latch 116 is reset by NOR-operating and inverting power-up signal VCCHB and auto pulse SAP and so by operating an NMOS transistor N101. The latch may be determined so that the first and second period control signals TS have a high level at reset.

The power-up signal VCCHB is supplied at a high level at initialization when the power source voltage is powered up, and is supplied in a low level after the normal power-up of power source voltage. Further, the auto pulse signal SAP may be a pulse signal having a very short section of high level responding to self refresh start signal SRS or self refresh completion signal SRS.

Figure 7:
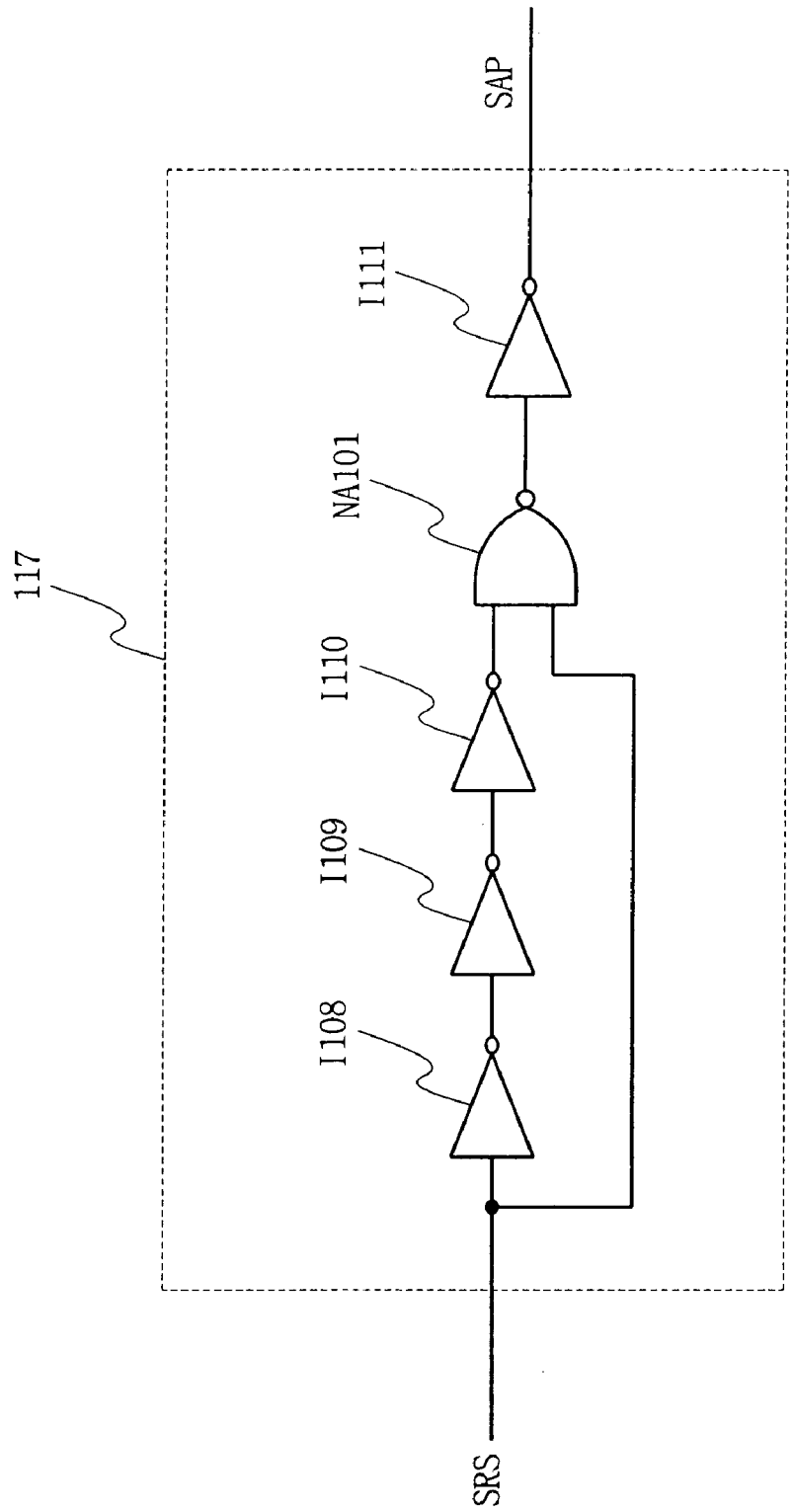
FIG. 7 is a detailed circuit diagram of an applied example of the auto pulse generator shown in FIG. 5.

FIG. 7 is a circuit diagram illustrating in detail an applied example of an auto pulse generator 117 shown in FIG. 5.

With reference to FIG. 7, the auto pulse generator 117 can include at least one or more odd-number of inverters I108, I109 and I110 for inverting the self refresh completion signal SRS and for outputting the signal delayed by a predetermined time; a NAND circuit NA101 for receiving the self refresh completion signal SRS and the delayed signal and performing a NAND operation on them; and an inverter I111 for inverting an output of the NAND circuit NA and outputting an auto pulse SAP. The auto pulse has a high level by an output of the NAND circuit NA101 and the inverter I111, simultaneously to generate the self refresh completion signal SRS, and then, again has a low level when the self refresh completion signal SRS delayed by the inverters I108, I109 and I110 reaches the NAND circuit NA101 and the inverter I111. In other words, the auto pulse may be a single pulse signal that maintains a high level section only by a delay time of the inverters I108, I109 and I110.

Figure 9:
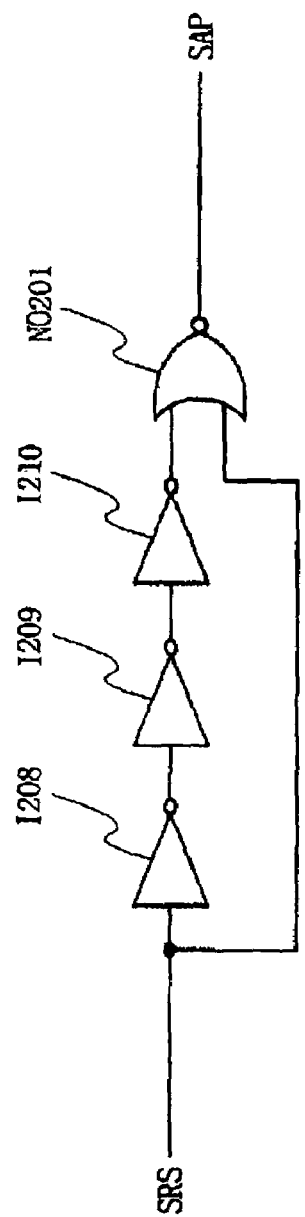
FIG. 9 is a detailed circuit diagram of another example of the auto pulse generator shown in FIG. 5.

In another embodiment as shown in FIG. 9, the auto pulse generator 117 may include at least one inverter I208, I209, I210 for inverting the self refresh start signal SRS and outputting the signal delayed by a predetermined time when generating a single pulse in response to the self refresh start signal SRS; and a NOR circuit NO201 for receiving the self refresh start signal SRS and the delayed signal, and performing a NOR operation on them and outputting an auto pulse signal SAP.

Figure 8:
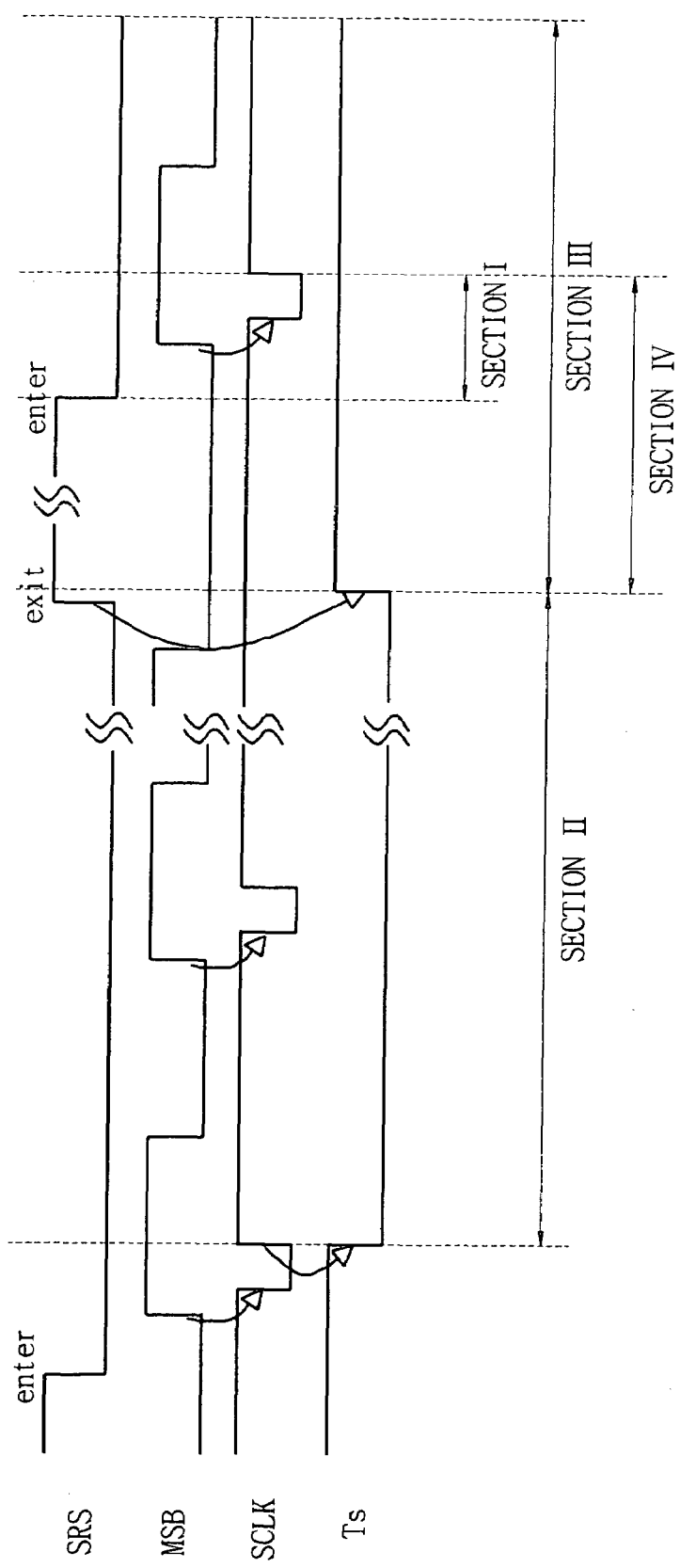
FIG. 8 is a timing diagram of the operations of the circuits of FIGS. 5-7.

FIG. 8 is a timing diagram illustrating the operation of the temperature sensor part 110 shown in FIG. 5.

Referring to FIGS. 4 to 8, the operation of self refresh period control circuit will be described as follows, according to an exemplary embodiment of the invention. The exemplary embodiment will be described for the case where the first period control signal Ts is generated in response to the self refresh completion signal. The other case where the first period control signal Ts is generated in response to the self refresh start signal, will be readily understood by those skilled in the art based on the description of the first case.

As shown in FIGS. 4 to 8, clock signals MSB and TCLK having a number of bits used as a clock of controlling a period of refresh are generated in the clock generating part 130, in response to self refresh start signal SRS,enter. The sampling clock generator 118 generates a sampling clock signal SCLK in response to clock signal MSB having a longest period among clock signals MSB and TCLK having a number of bits. The sampling clock signal SCLK has the same period as the clock signal MSB, but is a pulse signal having a short low level section as compared with a high level section. The clock signal MSB having a longest period and the sampling clock signal SCLK are shown as an example in FIG. 8.

The temperature sensor 112 operates only in a low level section of the sampling clock signal SCLK, but does not operate in a high level section. The temperature sensor 112 generates a temperature signal Ti indicating an operating temperature of a semiconductor memory device during operation. Herewith, the semiconductor memory device is provided with a self refresh period control circuit according to an exemplary embodiment of the invention.

After the start of the refresh operation, the temperature sensor 112 senses an operating temperature of semiconductor memory device, and when higher than a reference temperature, generates the temperature signal Ti in a high level, and when lower than a reference temperature, generates the temperature signal Ti of low level. In one embodiment, the reference temperature is determined as 45° C. The temperature sensor 112 may determine several reference temperatures to generate temperature signal Ti having a number of bits per section on the basis of them.

The temperature signal Ti is amplified by the amplifier 114 and generates an amplified temperature signal TA.

The latch 116 latches such temperature signal TA changed in level and generates a second period control signal TS. In other words, the latch 116 receives a temperature signal TA and latches a second period control signal TS at a high level when the temperature signal TA has the high level in response to a sampling clock signal SCLK, and then, when the temperature signal TA is lowered to a low level, the second period control signal TS is also lowered to a low level. That is, the latch 116 retains the output of the temperature sensor 112 even if the temperature sensor 112 does not operate. The period control signal TS is applied to the period magnification control part 120. The latch 116 is configured to determine an initial value in a supply of initially supplied power source in a high level.

The latch 116 is initialized by single pulse SAP generated by the auto pulse generator 117 that responds to self refresh completion signal SRS, exit. Thus, the latch 116 generates a first period control signal TS at a high level.

FIG. 8 illustrates a generation section II of second period control signal TS, a generation section IV of first period control signal TS, and a low temperature section II and a high temperature section III. During section I from a restart of refresh through a re-generation of self refresh start signal SRS,enter after a self refresh completion signal SRS,exit, to before operation of the temperature sensor 112; a refresh is performed with a shortest period on the basis of high temperature. Hence, the present invention resolves the problem of a self refresh operation causable by a temperature change during a section (in this example, Section IV) that corresponds to the onset of a self refresh completion signal SRS,exit to the re-generation of the self refresh start signal SRS,enter.

The period magnification control part 120 decides and selects a period magnification of clock signal TCLK applied from the clock generating part 130, and generates a refresh period signal RS, in response to the state of the first and second period control signals Ts. When the first and second period control signals Ts have a high level, the refresh period is determined to be the lowest magnification, and when the first and second period control signals Ts have a low level, the refresh period is determined to be the highest magnification within a range of guaranteeing a refresh characteristic of semiconductor memory device.

In the refresh control part 140, the refresh is performed in response to the refresh period signal RS. The self refresh operation is completed by the self refresh completion signal SRS,exit.

As described above, according to an exemplary embodiment of the invention, an auto pulse is generated in response to a self refresh start signal or completion signal, then a latch is initialized to generate a first period control signal, thereby a refresh period appropriate to a refresh characteristic based on temperature can be obtained. That is, a self refresh characteristic provided from a start of self refresh to before an operation of the temperature sensor can be provided.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A self refresh period control circuit for controlling a refresh period of a semiconductor memory device, in response to an operating temperature of the device, the circuit comprising:
    a temperature sensor part for generating a first period control signal in response to a self refresh start signal or self refresh completion signal, sensing operating temperature of the semiconductor memory device in response to a clock signal generated in response to the self refresh start signal, and generating a second period control signal, wherein the temperature sensor part comprises an auto pulse generator for generating a single pulse in response to the self refresh start signal or self refresh completion signal, and wherein the first period control signal is generated in response to the single pulse of the auto pulse generator; and
    a period magnification control part for controlling a self refresh period in response to the first and second period control signals.

2. The circuit of claim 1, further comprising a refresh control part for performing a self refresh by the self refresh period selected by the period magnification control part.

3. The circuit of claim 1, wherein the temperature sensor part comprises:
    a sampling clock generator for generating a sampling clock signal having a predetermined period in response to a clock signal generated in response to the self refresh start signal;
    a temperature sensor for sensing the operating temperature of the semiconductor memory device and generating a temperature signal, in response to the sampling clock signal;
    an amplifier for amplifying the temperature signal;
    a latch for generating the first period control signal in response to the single pulse of the auto pulse generator, and latching an output signal of the amplifier and generating the second period control signal.

4. The circuit of claim 3, wherein the sampling clock signal has the same period as a clock signal generated in response to the self refresh start signal, and has a short low level section as compared with a high level section.

5. The circuit of claim 4, wherein the temperature sensor operates only in a low level section of the sampling clock signal.

6. The circuit of claim 5, wherein the amplifier and the latch operate by the sampling clock signal.

7. The circuit of claim 6, wherein the latch is initialized by the pulse generated by the auto pulse generator.

8. The circuit of claim 1, wherein the self refresh start signal and the self refresh completion signal are on the same signal line and a low level indicates the self refresh start signal and a high level indicates the self refresh completion signal.

9. The circuit of claim 8, wherein the auto pulse generator comprises:
    at least one inverter for inverting the self refresh completion signal and outputting a signal delayed by a predetermined time;
    a NAND circuit for receiving the self refresh completion signal and the signal delayed by the at least one inverter, to perform a NAND operation; and
    an inverter for inverting an output of the NAND circuit and generating a single pulse.

10. The circuit of claim 8, wherein the auto pulse generator comprises:
    at least one inverter for inverting the self refresh start signal and outputting a signal delayed by a predetermined time; and
    a NOR circuit for receiving the self refresh start signal and the signal delayed by the at least one inverter, to perform a NOR operation and generate a single pulse.

11. The circuit of claim 1, wherein the period magnification control part selects a signal having a shortest self refresh period among self refresh periods, in response to the first period control signal.

12. The circuit of claim 1, wherein the first period control signal and the second period control signal are transmitted on a common signal line.

13. A self refresh period control circuit for controlling a refresh period of a semiconductor memory device, in response to an operating temperature of the device, the circuit comprising:
    a temperature sensor part for generating a first period control signal in response to a self refresh start signal or self refresh completion signal, sensing operating temperature of the semiconductor memory device in response to a clock signal generated in response to the self refresh start signal, and generating a second period control signal; and
    a period magnification control part for controlling a self refresh period in response to the first and second period control signals,
    wherein the temperature sensor part comprises:
        a sampling clock generator for generating a sampling, clock signal having a predetermined period in response to a clock signal generated in response to the self refresh start signal;

a temperature sensor for sensing the operating temperature of the semiconductor memory device and generating a temperature signal, in response to the sampling clock signal;

an amplifier for amplifying the temperature signal;

an auto pulse generator for generating a single pulse in response to the self refresh start signal or self refresh completion signal; and a latch for generating the first period control signal in response to the single pulse of the auto pulse generator, and latching an output signal of the amplifier and generating the second period control signal.

14. The circuit of claim 13, wherein the sampling clock signal has the same period as a clock signal generated in response to the self refresh start signal, and has a short low level section as compared with a high level section.

15. The circuit of claim 14, wherein the temperature sensor operates only in a low level section of the sampling clock signal.

16. The circuit of claim 15, wherein the amplifier and the latch operate by the sampling clock signal.

17. The circuit of claim 16, wherein the latch is initialized by the pulse generated by the auto pulse generator.

18. A self refresh period control circuit for controlling a refresh period of a semiconductor memory device, in response to an operating temperature of the device, the circuit comprising:

a temperature sensor part for generating a first period control signal in response to a self refresh start signal or self refresh completion signal, sensing operating temperature of the semiconductor memory device in response to a clock signal generated in response to the self refresh start signal, and generating a second period control signal; and a period magnification control part for controlling a self refresh period in response to the first and second period control signals, wherein the self refresh start signal and the self refresh completion signal are on the same signal line and a low level indicates the self refresh start signal and a high level indicates the self refresh completion signal, and wherein the auto pulse generator comprises:

at least one inverter for inverting the self refresh completion signal and outputting a signal delayed by a predetermined time;

a NAND circuit for receiving the self refresh completion signal and the signal delayed by the at least one inverter, to perform a NAND operation; and an inverter for inverting an output of the NAND circuit and generating a single pulse.

19. A self refresh period control circuit for controlling a refresh period of a semiconductor memory device, in response to an operating temperature of the device, the circuit comprising:

a temperature sensor part for generating a first period control signal in response to a self refresh start signal or self refresh completion signal, sensing operating temperature of the semiconductor memory device in response to a clock signal generated in response to the self refresh start signal, and, in response to sensing the operating temperature, generating a second period control signal; and a period magnification control part for controlling a self refresh period in response to the first and second period control signals, wherein the self refresh start signal and the self refresh completion signal are on the same signal line and a low level indicates the self refresh start signal and a high level indicates the self refresh completion signal, and wherein the auto pulse generator comprises:

at least one inverter for inverting the self refresh start signal and outputting a signal delayed by a predetermined time; and a NOR circuit for receiving the self refresh start signal and the signal delayed by the at least one inverter, to perform a NOR operation and generate a single pulse.

* * * * *